US005824116A

United States Patent [19]

Zutler

[11] Patent Number: 5,824,116

[45] Date of Patent: Oct. 20, 1998

[54] IMAGED LIGHT SWITCH PLATE

[75] Inventor: Bruce Zutler, Port Washington, N.Y.

[73] Assignee: MCI Products Group, Inc., Plainview, N.Y.

[21] Appl. No.: 746,597

[22] Filed: Nov. 12, 1996

[51] Int. Cl.[6] ................................ D06P 5/00; H02G 3/14; H05K 5/03

[52] U.S. Cl. .......................... 8/471; 8/445; 8/467; 8/522; 216/28; 216/40; 347/171; 174/66

[58] Field of Search .............................. 137/359; 174/66, 174/67, 158; 220/241; 216/27, 40, 28; 248/49, 56; 503/227; 292/357; 362/404; 138/108, 113; 347/1, 2, 3, 107, 171, 120, 55, 187, 188; 8/471, 472, 506, 509, 522, 445, 467; 156/230, 235, 240

[56] References Cited

U.S. PATENT DOCUMENTS

| | | | |
|---|---|---|---|
| D. 230,700 | 3/1974 | Rochford et al. . | |
| D. 243,918 | 4/1977 | Creamer . | |
| 1,280,655 | 10/1918 | Briggs . | |
| 1,660,346 | 2/1928 | Neal . | |
| 2,043,865 | 6/1936 | Place . | |
| 4,354,851 | 10/1982 | Hix et al. | 8/471 |
| 4,355,198 | 10/1982 | Gartland, Jr. . | |
| 4,406,662 | 9/1983 | Beran et al. | 8/471 |
| 5,031,525 | 7/1991 | Kent et al. | 101/32 |
| 5,142,722 | 9/1992 | Kolb | 8/471 |
| 5,296,081 | 3/1994 | Morin et al. | 156/498 |

OTHER PUBLICATIONS

Orvis 1974 Christmas Catalogue (2 pages) Decoupage Switchplates.

Article from *The Engravers Journal*, Mar., 1994, "Ultra-Graphics From Xpres".

*Primary Examiner*—Michael P. Woodward
*Assistant Examiner*—Datquan Lee
*Attorney, Agent, or Firm*—Gottlieb, Rackman & Reisman, P.C.

[57] ABSTRACT

A method for applying an image to a light switch plate is provided. The method specifically enables the application of an image continuously and without interruption to both the surface of the plate and to the heads of the screws that are used in mounting the plate to a wall or other supporting surface.

6 Claims, 3 Drawing Sheets

FIG. 3
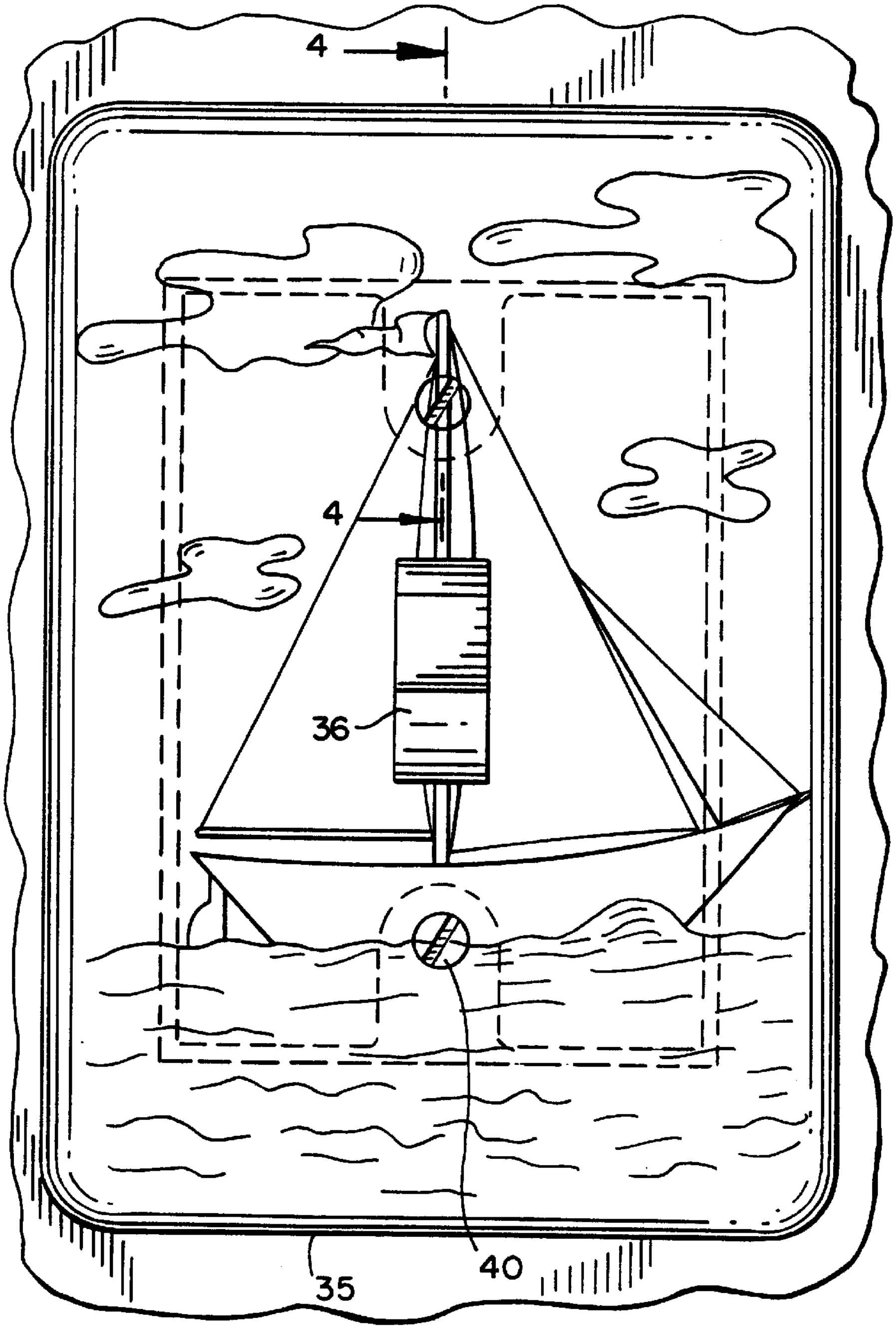
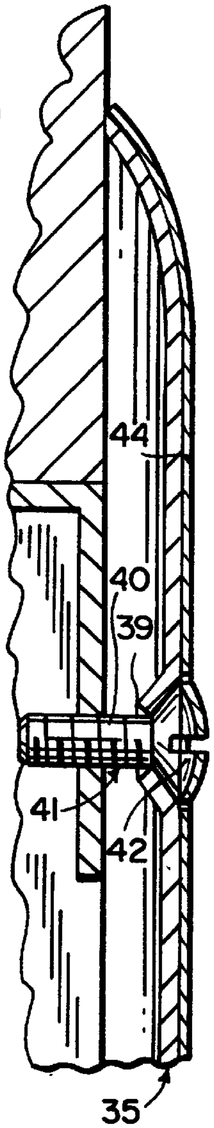
FIG. 4

IMAGED LIGHT SWITCH PLATE

BACKGROUND OF THE INVENTION

This application relates to the manufacture and preparation of an imaged light switch plate or other decorative accessory, and more particularly to a method for applying an image to a light switch plate, in which the image is presented continuously and without interruption to both the surface of the plate (including the contoured perimeter) and to the heads of the screws used to mount the plate on a wall or other supporting surface.

A process of depicting an image onto any accessory item including a metallic switch plate can be referred to in the industry as sublimation. Sublimation is an imaging method that has been widely used for many years in a range of industries and products. In sublimation, a dye image is applied to the surface of an item. The process utilizes a paper transfer containing an image made up of special sublimating dyes. A heat press is then used to transfer the dye from the paper to the item that is to be decorated. The combination of heat and pressure from the heat press causes the dye to change from a solid to a gas. The plate then absorbs the dye, which then returns to a solid state.

In the application of a dye sublimation process to a metal switch plate, as well as to other types of items such as ceramic mugs and tiles, it is necessary to have a special sublimation-receptive polymer coating applied to the plate in order to achieve a permanent, good-quality printed design.

While conventional dye sublimation printing is suitable for applying an image to a metal switch plate, it has generally not been found suitable for applying an image both to the plate surface itself and to the heads of the screws that are used to mount a plate on a wall or other supporting surface. Typically, a switch plate is formed with a central slot or opening for receiving the operating toggle of a light switch, and a pair of holes located respectively above and below the slot, through which the mounting screws are received. Therefore, if an image is applied to the surface of a switch plate, it is interrupted where the screw holes are located, providing a less than desirable look to the observer.

One other method that has been tried is decoupage, which is wrapping paper over the plate. This method is less than desirable since paper will end up on the back surface of the plate and the paper is not sufficiently durable. Moreover, while the screw holes are decorated, they are merely colored to complement the design on the rest of the plate instead of being decorated to provide a continuous and aesthetically pleasing image.

Accordingly, it is desirable to provide a method and system for applying an image to a light switch plate such that the image is applied both to the plate surface and to the heads of the corresponding screws that are used in mounting the plate.

SUMMARY OF THE INVENTION

Generally speaking, in accordance with the invention, a method for applying an image to a light switch plate is provided. The method specifically enables the application of an image continuously and without interruption to both the surface of the plate and to the heads of the screws that are used in mounting the plate to a wall or other supporting surface.

Initially, both the plate surface and the heads of the screws are treated in order to render both receptive to a dye-sublimation transfer process, In particular, a sublimation-receptive polymer coating is applied—this enables achievement of a permanent, good-quality printed design.

The next step is to prepare a paper transfer sheet containing an image made up of special sublimating dyes. The completed paper transfer sheet is then placed over the switch plate with the screws in place, such that the plate surface and the screw heads are in facing relationship with the surface of the transfer sheet having the image printed thereon.

A specially-designed heat press is then used to transfer the image from the paper to both the switch plate surface and the screw heads. The heat press includes a deformable rubberized member which presses against the transfer sheet so that it applies a uniform force along both the plate surface, the edges of the plate, and the screw heads. In addition, the specially designed heat press includes a pair of slots or receptacles for receiving the pins of the screws. The screw heads can then remain substantially flush along the surface of the plate while heat and pressure are applied in order to promote image transfer.

Preferably, a centering guide member is used to ensure proper alignment of the plate with the imaged paper.

Accordingly, it is an object of the invention to provide an improved method and system for preparing an imaged light switch plate or other decorative accessory.

Still another object of the invention is to provide an improved method and system for applying an image to both the surface of a light switch plate and to the heads of the screws that are used for mounting the plate.

Yet another object of the invention is to provide an improved method and system for preparing an imaged light switch plate or other decorative accessory utilizing an image transfer system.

Still other objects and advantages of the invention will in part be obvious, and will in part be apparent from the following description.

The invention accordingly comprises the several steps, and the relation of one or more of such steps with respect to each of the others, as well as the features of construction, combination of elements and arrangement of parts which will be exemplified in the system hereinafter described, and the scope of the invention will be indicated in the claims.

BRIEF DESCRIPTION OF THE DRAWINGS

For a fuller understanding of the invention, reference is made to the following description, taken in connection with the accompanying drawings, in which:

FIG. 3 is a top plan view of an imaged light switch plate made in accordance with the invention; and FIG. 4 is a cross-sectional view taken along line 4—4 of FIG. 3.

DETAILED DESCRIPTION OF THE PREFERRED EMBODIMENT

Figure 1:
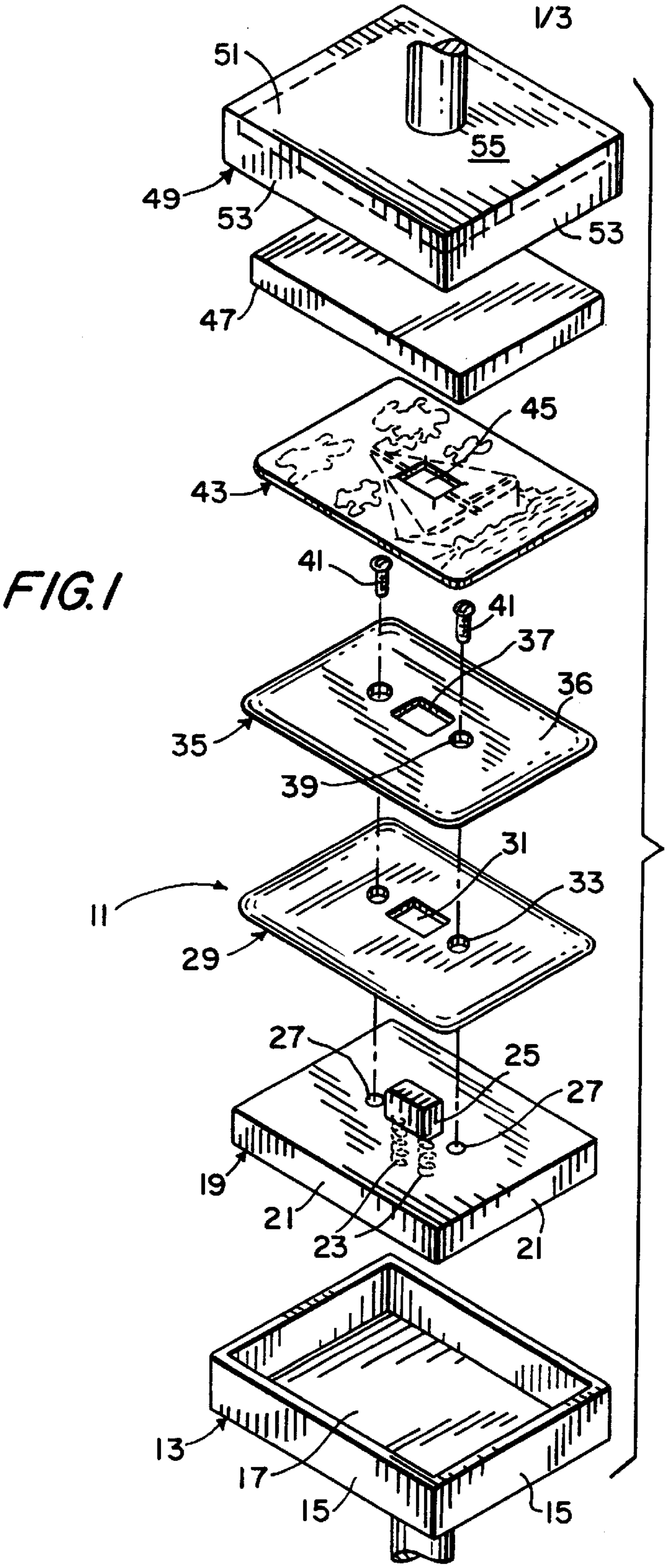
FIG. 1 is an exploded perspective view of the various components of the system used in the inventive process.

Beginning with FIG. 1, a light switch plate, generally indicated at 35, to which an image is to be applied in accordance with the inventive method, is shown. Light switch plate 35 is made of metal, and has a substantial rectangular configuration. Plate 35 includes a centrally disposed opening or slot for selectively receiving a toggle 36 (see FIG. 3) of a light switch when plate 35 is mounted on a wall. Plate 35 further includes a pair of holes 39, located respectively above and below opening 37, designed for receiving screws 41, as is well known in the art. Screws 41 are used in mounting plate 35 to a wall or other supporting surface. Each of screws 41 includes a head 42 and an extending threaded pin 40, as is well known.

Plate 35 includes a front surface 36 which will be visible when plate 35 is mounted to the wall. Surface 36 of plate 35 and heads 42 of screws 41 are first coated with a special sublimation-receptive polymer coating that is used to make the surfaces receptive to a dye sublimation transfer process. This surface treatment process is well known in the art, as described hereinabove, and is typically achieved by spraying the coating material directly onto the plate surface and screw heads. Once the coating has been applied to both, plate 35 and screws 41 are now ready for dye-sublimation printing, as described below.

Referring once again to FIG. 1, in order for the dye-sublimation process to be carried out, a paper transfer sheet, generally indicated at 43, is used. Sheet 43 is substantially rectangular in configuration, and is of substantially the same size and shape as plate 35. Sheet 43 is prepared with an image 44 (see FIG. 4) printed with sublimating dyes on one side thereof, as shown. Once the image has been applied to paper 43, paper 43 is then formed with a central cutout 45. During dye sublimation transfer, cutout 45 will be aligned with opening 37 formed in switch plate 35.

Continuing still with FIG. 1, the press system of the invention, generally indicated at 11, is now further described. Press system 11 includes a bottom press plate 13 and a top heating plate 49. Bottom press plate 13 has a substantially rectangular configuration. Plate 13 includes a panel 17 and side walls 15, which together define an interior or inside compartment that is suitable for receiving a base plate 19 therein, as best shown in FIG. 2.

Figure 2:
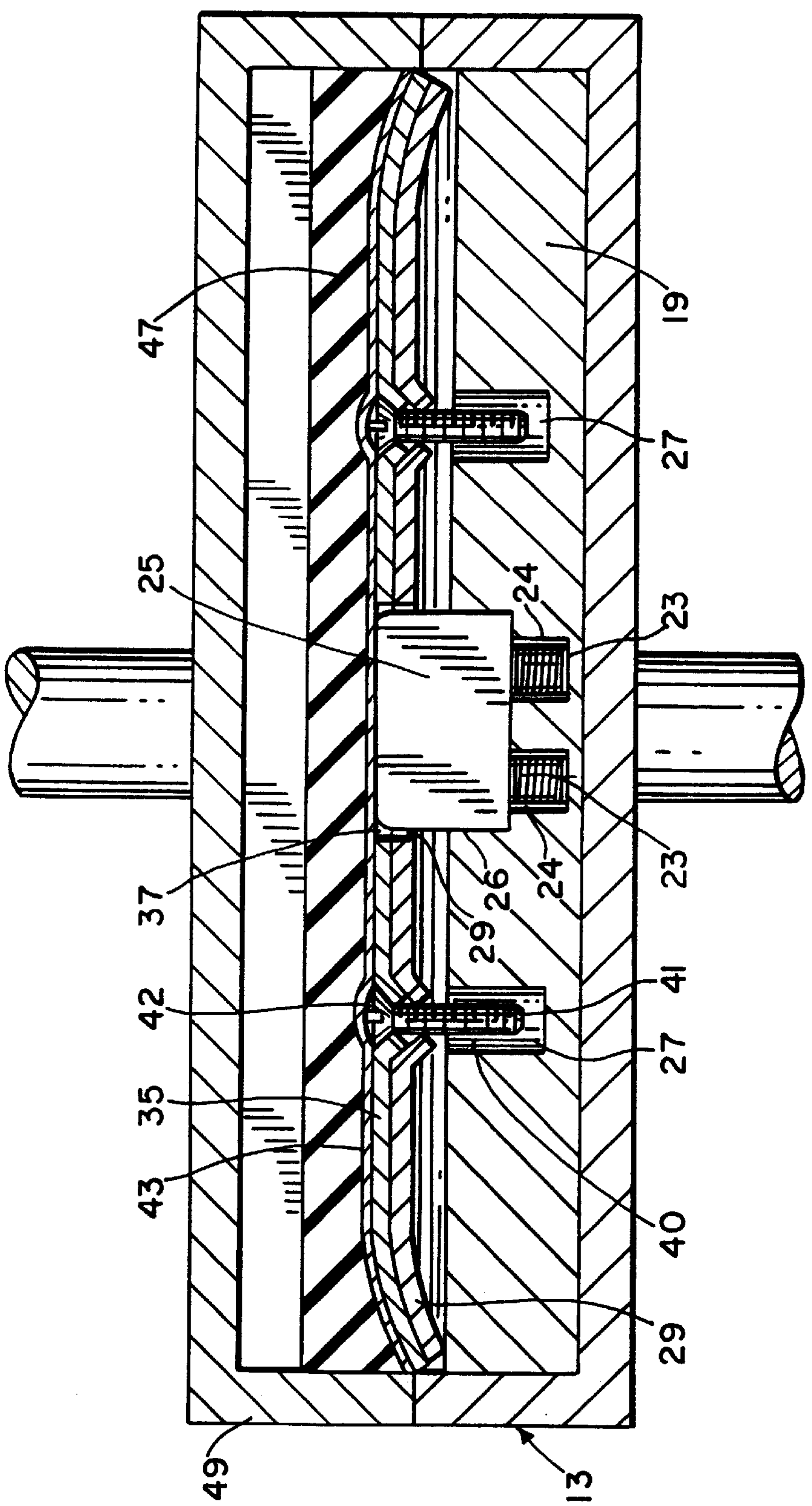
FIG. 2 is a cross-sectional view of the press system used in the inventive process while pressure is being applied to cause image transfer from said paper transfer sheet to a switch plate.

Referring both to FIGS. 1 and 2, base plate 19 has a rectangular configuration and is defined by sides 21. Plate 19 includes a central cutout 26 for slidably receiving a guide member 25. Guide member 25 is used in aligning light switch plate 35 and transfer sheet 43 when heat and pressure are applied during the dye sublimation process, as described hereinafter.

In particular, guide member 25 sits on, and is otherwise engaged with a pair of springs 23 (see FIG. 2). Springs 23, in turn, are seated within corresponding bores 24 formed within base plate 19 and below cutout 26. Accordingly, when a force is exerted downwardly on guide member 25, it is forced downwardly into slot 26. When no force is applied, springs 23 urge guide member 25 upwardly out of slot 26 and past the top surface of base plate 19, as shown in FIG. 1.

Base plate 19 has a guide plate, generally indicated at 29, sitting atop thereof. Guide plate 29 is of a substantially rectangular configuration, and is of substantially the size as base plate 19. Guide plate 29 includes a central opening 31 through which guide member 25, projecting upwardly from plate 19, extends therethrough, and holes 33, located above and below opening 31, as shown. Holes 33 of guide plate 29 are aligned with holes 27 formed within base plate 19 when plate 29 is mounted thereover (see FIG. 2). Holes 27 and 33 selectively receive screws 41 of light switch plate 35, as now described.

In order to carry out the dye sublimation process in accordance with the inventive technique, switch plate 35, now treated with a coating to make the surface thereof receptive to dye sublimation transfer, is placed over guide plate 29 (now mounted on base plate 19), such that guide member 25 extends through opening 37 thereof, as best shown in FIG. 2. Then, screws 41 are inserted through holes 33 and 39 of plates 35 and 29, such that threaded pins 41 thereof are received within holes 27 formed in base plate 19, and heads 42 are situated substantially flush along surface 36 of plate 35.

Once plate 35 and screws 41 are appropriately positioned, transfer sheet 43 is then placed on top of plate 35, with the image side down and facing surface 36 of plate 35. Significantly, transfer sheet 43 includes cutout 45 which receives guide member 25 projecting up from base plate 19. As a result, transfer sheet 43 is placed in proper aligned position with respect to plate 35 during dye sublimation transfer.

Heating plate 49, discussed above, is formed with a recess 55 for receiving a deformable member, generally indicated at 47. Member 47 is made from a rubberized material, and fits snugly within recess 55 of plate 49.

With special attention to FIG. 2, the dye sublimation process in accordance with the invention is now described. Press system 11 is operated by urging top heating plate 49 and bottom press plate 13 together. Significant pressure is then applied between transfer sheet 43 and light switch plate 35 in a range between about 15–25 p.s.i. When this pressure is applied, guide member 25, depending upwardly from base plate 19, is pushed downwardly against the urging of springs 23. Rubberized member 47 enables the entire surface of transfer sheet 43 to be pressed against surface 36 of switch plate 35, included in its periphery, as well as heads 42 of screws 41.

At the same time, heat is applied to press system 11 at a temperature of between about 250°–300° F. for between 15 and 25 seconds through heating plate 49 by means of an electric heating element, as is well known. In other words, a combination of heat and pressure is applied when operating the system, which causes the image printed on the underside of transfer sheet 43 to be transferred along surface 36 of plate 35 and the heads of screws 41.

Once the dye sublimation transfer is completed, the heat is removed, and the applied pressure of press system 11 is relieved. Switch plate 35 and screws 41 may now be removed, and will be in the condition depicted in FIGS. 3 and 4. As can be appreciated, image 44 on transfer sheet 43 is now printed continuously along all of surface 36 of plate 35 and the surface of heads 42 of screws 41. This provides a very distinctive decorative appearance—the image is continuous, even where screws 41 are received by plate 35, or along the edges of the plate. Imaged plate 35 may now be mounted on a wall or other appropriate surface, as shown in FIGS. 3 and 4, providing a unique and decorative look.

Although the preferred system utilized a dye sublimation transfer process, other image transfer processes known in the art may be used in carrying out the system without departing from the scope of the invention.

Although the system of the invention is described for imaging a light switch plate, the inventive system may be used for other types of decorative accessories, such as a wall clock, wall plaque, and certain wall artwork.

It will thus be seen that the objects set forth above, among those made apparent from the preceding description, are efficiently obtained and, since certain changes may be made in the above process, and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

I claim:

1. A method for applying an image to one surface of a decorative accessory and a head of at least one screw used for mounting said accessory to a wall or other supporting surface, the method comprising the steps of:

preparing a thermal paper transfer sheet in order to create a pictorial image or illustration on one side thereof;

inserting said at least one screw through a pre-designed hole formed in said accessory such that said one surface and said screw head face in a common direction;

positioning said one side of said transfer sheet in facing relationship with said accessory surface and said screw head;

pressing together said paper transfer sheet and said accessory while said head of said inserted at least one screw remains flush along aid accessory's surface; and applying heat to said sheet and said accessory during said pressing step in a quantity sufficient to cause said pictorial image to be transferred simultaneously along said accessory surface and said screw head such that said image is pictured continuously and without interruption therealong.

2. The method of claim 1, further including the step of treating said accessory surface and said screw head in order to render both receptive to an image transfer process.

3. The method of claim 2, wherein said treating step utilizes a polymer coating that is applied to said plate surface and said screw head.

4. The method of claim 3, wherein said coating is applied by spraying.

5. The method of claim 1, wherein said preparing step includes cutting out an opening in said sheet that is suitable for alignment with an opening formed in said accessory.

6. The decorative accessory and at least one screw produced by the method of claim 1.

* * * * *